United States Patent [19]

Lauper et al.

[11] Patent Number: 5,063,354

[45] Date of Patent: Nov. 5, 1991

[54] FREQUENCY SYNTHESIZING DEVICE

[75] Inventors: Alfred Lauper, Zurich; Hanspeter Küpfer, Birmensdorf; Daniel Rieder, Birmensdorf, all of Switzerland

[73] Assignee: Siemens-Albis Aktiengesellschaft, Zurich, Switzerland

[21] Appl. No.: 453,540

[22] Filed: Dec. 20, 1989

[30] Foreign Application Priority Data

Dec. 23, 1988 [CH] Switzerland ............... 04781/88

[51] Int. Cl.⁵ .................................. H03L 7/16
[52] U.S. Cl. ........................... 328/14; 328/15; 364/484; 307/262
[58] Field of Search ............... 328/14, 15; 331/2; 307/529, 262; 377/43, 49; 364/484

[56] References Cited

U.S. PATENT DOCUMENTS

| | | | |
|---|---|---|---|
| 3,696,306 | 10/1972 | Kline | 331/2 |
| 4,142,245 | 2/1979 | Baron | 328/14 |
| 4,303,837 | 12/1981 | Ansaldi et al. | 328/14 |
| 4,558,282 | 12/1985 | Lowenschuss | 328/14 |
| 4,943,779 | 7/1990 | Pedersen | 328/14 |

Primary Examiner—John S. Heyman
Attorney, Agent, or Firm—Adel A. Ahmed

[57] ABSTRACT

A frequency synthesizing device generates periodic electrical oscillations of a frequency that can be arbitrarily determined, in which, after changing the frequency and resetting it to any desired value that has previously been generated, phase coherence is maintained. In addition to the elements of a direct digital frequency synthesizing device, the arrangement according to the invention has a time measuring unit (ZME) and a control logic (SL). The time measuring unit (ZME) periodically counts through a time interval from $t=0$ to $t=t_z$ and transmits the count status or a time signal to the computing system (R). The frequencies $f_i$ to be emitted and the time interval from $t=0$ to $t=t_z$ are chosen in such a manner that the phases of all the frequencies $f_i$ take on a constant value at the time $t=0$. This makes it possible to compute the coherent starting phase $\phi_N$, so that the new frequency $f_N$ can be generated, with phase coherence, as of the time $t_N$, even after one or more changes of frequency.

Pat. No. 3,527 Col. 1

9 Claims, 3 Drawing Sheets

FREQUENCY SYNTHESIZING DEVICE

BACKGROUND OF THE INVENTION

The present invention relates to frequency synthesizing devices and it relates, more particularly, to such devices wherein periodic electrical oscillations are arbitrarily determined at a frequency that is changed and reset to a desired value while maintaining phase coherence.

In radio and radar technology, transmitters are employed utilizing transmitting frequencies that are changed rapidly over large frequency spans. A rapid change of frequencies makes it possible to dispense with, for example, powerful, narrow-band interfering transmitters. In order to obtain a useful signal with a minimum of interference, in this case the signals arriving at the receiver should be demodulated in a phase-coherent manner. A prerequisite for phase-coherent demodulation is that the phase position of the transmission signals and the reference signals fed to the demodulator return to a predetermined value after each change of frequency.

U.S. Pat. No. 3,696,306 discloses a phase-coherent frequency synthesizing device for generating an electrical oscillation whose phase position always takes on a predetermined value after rapid, drastic changes in frequency. The disadvantages of this circuit, which is constructed in analog technology, are the large amount of circuitry required and a relatively long switching time for a change of frequency. In addition, a small line interval for the resulting frequency allocation scheme can be obtained only by means of extensive additional circuitry.

In the journal "RF Technology" (1987) 5, the article entitled "Direct Numerical Synthesis of Sine Waves" by Fred Williams describes the construction of a direct digital frequency synthesizing device which permits electrical oscillations to be generated in the time range. This digital frequency synthesizing device has a simple circuit arrangement, which can be obtained with a few integrated building blocks. However, the frequency switching in this device is phase-continuous, that is, the final value of the phase $\phi_A$ of the previously generated frequency $f_A$ is equal to the starting value of the phase $\phi_N$ of the new frequency $f_N$.

SUMMARY OF THE INVENTION

It is an object of the present invention therefore to provide an improved frequency synthesizing.

Both a method and apparatus providing an illustrative embodiment of a frequency synthesizer are disclosed. The synthesizer includes control logic and a time measuring unit which serve to provide phase coherence and the capability of sweeping relatively large frequency bands while providing a reset frequency as a starting point.

Some of the most important advantages of the frequency synthesizing device in accordance with the invention enable a simple digital circuit design and the possibility of performing rapid, phase-coherent frequency changes, even when there is only a small time interval in the frequency allocation scheme.

BRIEF DESCRIPTION OF THE DRAWING

Features of the invention and additional objects of the invention will be more readily appreciated and better understood by reference to the following detailed description which should be considered in conjunction with the drawing.

DETAILED DESCRIPTION

Figure 1:
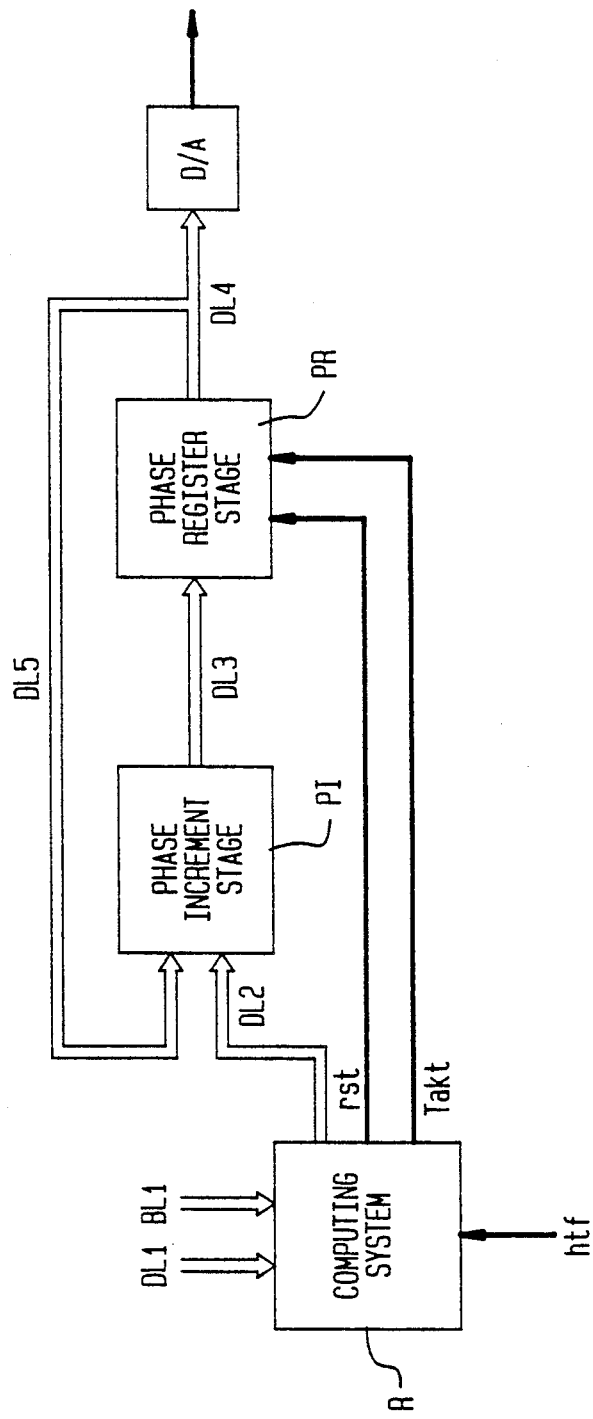
FIG. 1 illustrates the construction of a conventional direct digital frequency synthesizing device (DDS).

In FIG. 1, the conventional frequency-synthesizing device includes a computing system R, a phase increment stage PI, a phase register stage PR and a digital-/analog converter D/A.

A master clock frequency htf and, over a parallel data line DL1, the value of a new frequency $f_N$ that is to be generated are fed to the computing system R. The command to read in the received data and to change the frequency is forwarded to the computing system over the command line BL1. For the new input frequency $f_N$, the computing system R computes the phase change $\Delta\phi_N$, which corresponds to a time interval $t_p$ ($\Delta\phi_N = 2\pi f_N \times t_p$). In the phase increment stage PI, the content of the phase register stage PR, which is fed to the phase increment stage PI over a data line DL5, is periodically added or incremented with a value transmitted over a data line DL2 that corresponds to the computed phase change $\Delta\phi_N$ and carried over a data line DL3 to the input of the phase register stage PR. The duration of this periodic procedure is determined by the clock frequency fed to the phase register stage and, in this case, corresponds to the time interval $t_p$. The content of the phase register stage PR is forwarded over a data line DL4 to the digital-analog converter D/A, which emits a signal with the frequency $f_N$ ($f_N = \Delta\phi_N / 2\pi t_p$). In order to ensure that the frequency to be emitted is determined unambiguously, at least two registration values for each period of the emitted frequency should be fed to the digital-analog converter D/A. One run of the phase register stage PR corresponds, in this case, to one period of the emitted oscillation. The initial phase $\phi_N$ of a new frequency $f_N$ corresponds, in this device, to the content that happens to be present in the phase register stage PR, that is, the phase of the previous oscillation passes almost continuously into the phase of the new oscillation.

Figure 2:
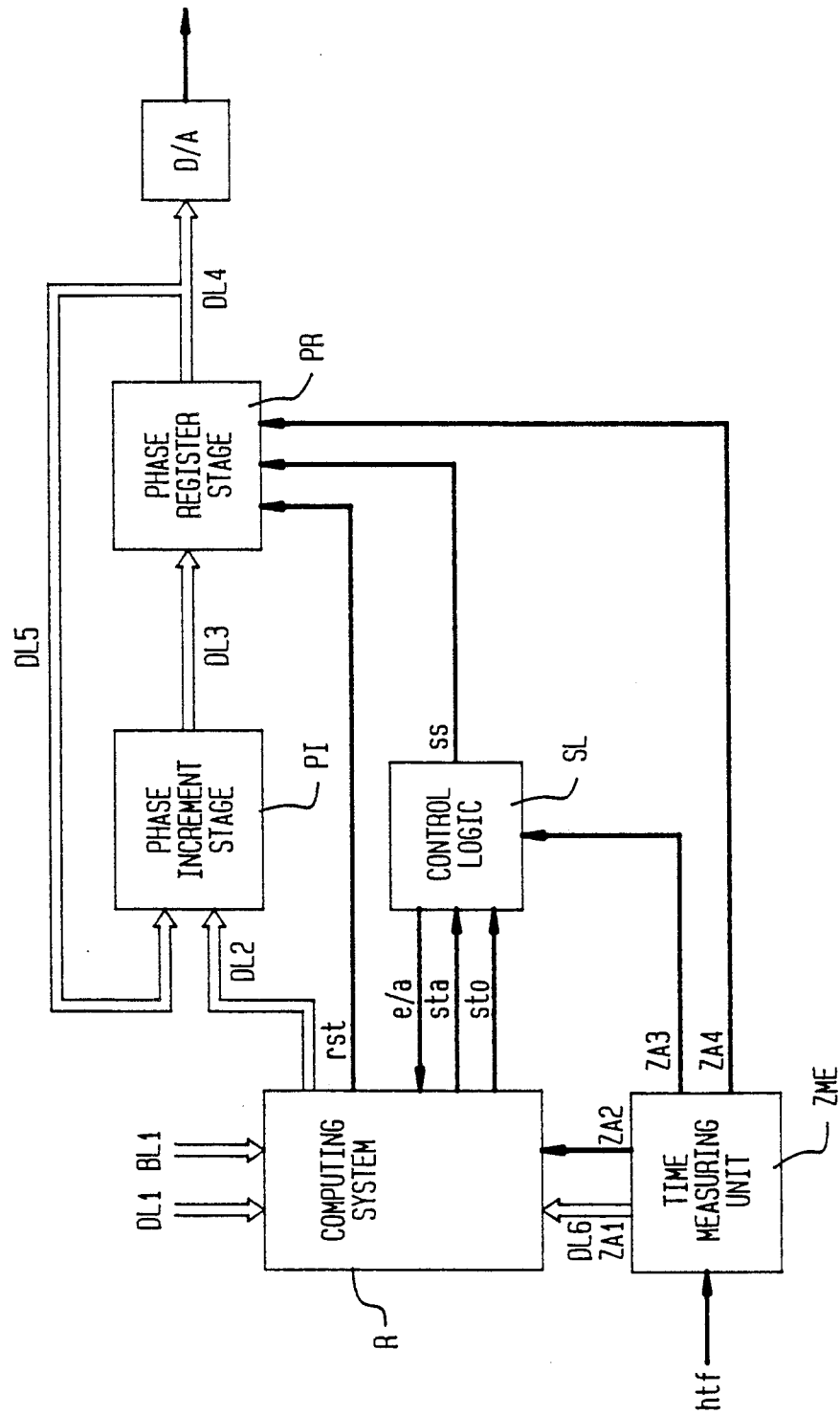
FIG. 2 presents the construction of a frequency synthesizing device according to the invention.

The frequency synthesizing device according to the invention that is shown in FIG. 2 has, in addition to the circuit shown in FIG. 1, a time measuring unit ZME and a control logic SL. The time measuring unit has four outputs ZA1, ZA2, ZA3 and ZA4 and receives, through the input ZE1, a master clock frequency htf, from which all the clock and time signals are derived in the frequency synthesizing device. The outputs ZA1 and ZA2 of the time measuring unit ZME, which emit a time signal over a parallel data line DL6 and a clock signal over another line, are connected to the computing system R. From the output ZA3 of the time measuring unit ZME, a clock line is applied to the phase register stage PR. The computing system R is connected to the control logic SL by two command lines sta (increment start) and sto (increment stop) and to the phase register stage PR by a reset line rst. From the control logic SL, a line ss (increment start/stop) is connected to the phase register stage PR. A status line e/a which shows at what counting time $t = t_A$ the increment procedure is stopped leads from the control logic SL to the computing system R.

The time measuring unit ZME periodically maintains a time interval from $t=0$ to $t=t_z$ and transmits the current count status through the meter output ZA1 to the computing system R. The time interval from $t=0$ to $t=t_z$ and the frequencies $f_i$ that can be generated are determined in such a manner that the time interval from $t=0$ to $t=t_z$ corresponds in each case to a whole-number multiple of the period length of all the frequencies $f_i$ that can be generated. As a result, the phases $\phi_i$ of all the frequencies $f_i$ that can be generated for the time $t=0$ take on a constant value, which makes it possible to compute a coherent phase value $\phi_N$ for a frequency $f_N$ for a subsequent time $t_N$ ($\phi_N = |\tfrac{1}{2}\pi f_N \times t_N + \phi_O|$/mod $2\pi$), even after the frequency has been changed several times and the time $t_z$ has been passed. The value for the phase angle $\phi_O$ must be the same for all computations of the initial phase angle $\phi_N$ and is ordinarily equal to zero.

The resulting minimum line interval $\Delta f_{min}$ of the frequency allocation scheme that is to be emitted can be computed as follows: for the first frequency $f_1$, we have: $m \times 1/f_1 = t_z$, or $f_1 = m/t_z$, for the next higher frequency $f_2 = f_1 + \Delta f_{min}$ we have: $(m+1) \times 1/f_2 = t_z$ or $(m+1) = (f_1 + \Delta f_{min}) \times t_z = (m/t_z + \Delta f_{min}) \times t_z = m$ or $1 = \Delta f_{min} \times t_z$. Consequently, the minimum line interval $\Delta f_{min}$ corresponds to the reciprocal of the time interval from $t=0$ to $t=t_z$ ($\Delta f_{min} = 1/t_z$). By increasing the time interval from $t=0$ to $t=t_z$, we can thus obtain an arbitrarily narrow line interval for the frequency allocation scheme. As long as the time interval from $t=0$ to $t=t_z$ is never exceeded, any desired frequencies can be generated with phase coherence.

The procedure for a frequency change is described in greater detail below, with the aid of the time diagram in FIG. 3.

Figure 3A:
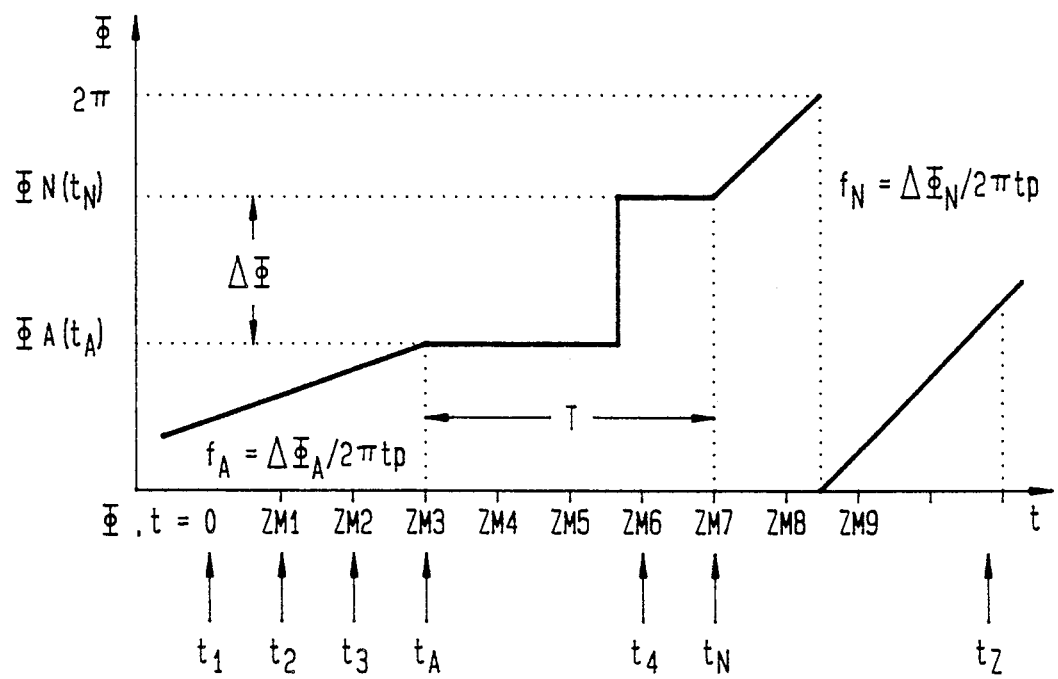
FIG. 3a and 3b are time diagrams providing two possibilities for the time sequence of a frequency change.

As shown in FIG. 3a, at time $t_1$ a new frequency fn is read into the computing system R and stored there. At time $t_2$, the command goes to the computing system R to replace the frequency $f_A$ then being generated with the new frequency $f_N$. At time $t_3$, the computing system sends a stop-increment instruction [over the line sto] to the control logic SL, which, upon the arrival of the next timing mark ZM$_3$—in other words, at the time $t_4$—stops the increment procedure over the line ss (increment start/stop). The stopping of the increment procedure is communicated to the computing system R over the status line e/a. The computing system R now computes the time $t_N$ ($t_N = t_4 + T$), where the time interval T is a constant delay, which should, if possible, correspond to a whole-number multiple of the interval between two timing marks ZM), the future phase increments $\Delta\phi_N = 2\pi f_N \times t_p$, the value of the phase $\phi_A$ at the time $t_A$ ($\phi_A(t_A) = 2\pi f_A \times t_A$) and the value of the phase $\phi_N$ for the time $t_N$ ($\phi_N(t_N) = 2\pi f_N \times t_N$). The time interval T ($T = t_N - t_A$) is a constant delay, which is required for computing and controlling procedures from the time the old frequency $f_A$ is stopped until the new frequency $f_N$ is generated. In addition, the phase difference $\Delta\phi = \phi_N(t_N) - \phi_A(t_A)$ is calculated by the computing system R and added (or incremented) to the content of the phase registration stage PR.

At the end of the delay time T, at the time $t_N$, which in the present example coincides with the timing mark ZM$_7$, the increment procedure is resumed. For this purpose, the computing system R sends at time $t_4$, shortly before the arrival of the timing mark ZM$_7$, a start-increment command over the line sta to the control logic SL, which, upon the arrival of the timing mark ZM$_7$ starts the increment procedure over the line ss. Accordingly, the new frequency $f_N$ is generated as of the time $t_N$ with the initial phase $\phi_N$. Then the old frequency $f_A$ is replaced in the memory of the computing system R by the new frequency $f_N$ which has already been started, so that the frequency synthesizing device is ready for a new, phase-coherent change of frequency. Instead of computing the phase values $\phi_A$ for the time $t_A$ in each case, the content of the phase register stage PR could also be read, after the increment procedure has been stopped, into the computing system R over an additional data line.

The timing marks ZM which are emitted periodically by the time measuring unit ZME to the control logic SL thus simplify the frequency-changing procedure, since the time $t_A$, the constant delay T and, consequently, the time $t_N$ can be more easily determined or computed, as the case may be.

Figure 3B:
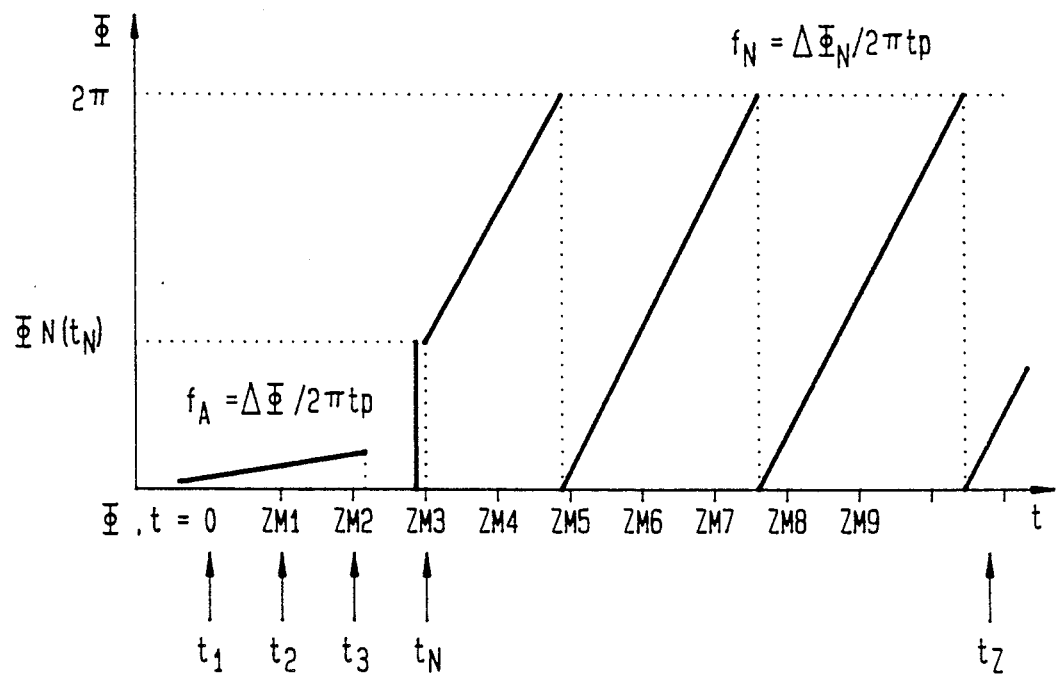

A simplified possibility for a phase change with a shorter switching time is shown in FIG. 3b. At time $t_1$, a new frequency $f_N$ is read into the computing system R and stored there. The computing system R then calculates the future phase increment $\Delta\phi_N$. At time $t_2$, the command goes to the computing system R to replace the frequency $f_A$ then being generated with the new frequency $f_N$. The computing system then calculates a future time $t_N$; for example, in such a manner that the time $t_N$ coincides with the following third timing mark ZM$_3$. Next, the computing system R, by means of the values $t_N$ and $f_N$, computes the starting phase $\phi_N(t_n)$ for the time $t_N$. After this value has been computed, at time $t_3$, the increment procedure is stopped and the phase register stage PR is reset to zero. Then the phase register stage PR is incremented by the value of the computed starting phase $\phi_N(t_N)$. At the time $t_N$, the increment procedure is restarted with the increments $\Delta\phi_N$ that have been previously computed.

There has thus been shown and described a novel frequency synthesizer device which fulfills all the objects and advantages sought therefor. Many changes, modifications, variations and other uses and applications of the subject invention will, however, become apparent to those skilled in the art after considering this specification and the accompanying drawing which disclose the preferred embodiments thereof. All such changes, modifications, variations and other uses and applications which do not depart from the spirit and scope of the invention are deemed to be covered by the invention which is limited only by the claims which follow.

We claim:

1. A method for the generation of periodic electrical oscillations at a frequency that can be arbitrarily determined, in which, after changing the frequency and resetting it to any desired value that has previously been generated, phase coherence is maintained, the method comprising the steps of: periodically counting a time interval from $t=0$ to $t=t_z$; computing in advance for a subsequent time $t_N$ ($0 < t_N < t_z$) the starting phase $\phi_N$ of a new frequency $f_N$; and generating the frequency $f_N$ from the time $t_N$ with the starting phase $\phi_N$.

2. A method according to claim 1, wherein the starting phase $\phi_N$ is computed by the formula $\phi_N = \tfrac{1}{2}\pi f_N t_N + \phi_O$/mod $2\pi$, where the phase $\phi_O$ is the same for all the new frequencies $f_N$ that are to be generated.

3. A method according to claim 2, wherein in order to generate desired frequencies $f_N$, the counted time interval from $t=0$ to $t=t_z$ is chosen in such a manner that the last frequency change takes place prior to the moment when the time $t_z$ is passed for the first time.

4. A method according to claim 2, wherein after the time $t_z$ has been passed for the first time, only frequencies with a period length whose whole-number multiple corresponds to the time interval from $t=0$ to $t=t_z$ are generated.

5. A method according to either claim 3 or 4, wherein prior to the generation of an oscillation with a new frequency $f_N$, the generation of the old oscillation with the old frequency $f_A$ is discontinued at a time $t_A$ $(0 \leq t_A \leq t_z)$.

6. A method according to any one of the preceding claims 1–4, wherein periodic timing marks (ZM) are generated, by means of which various times (e.g., $t=0$, $t_z$, $t_A$ and/or $t_N$) are determined, so that the time $t_A$ coincides with a timing mark $(ZM_1)$ and the time $t_N$ coincides with one of the following timing marks $(ZM_{(1+x)})$.

7. A method according to any one of claims 1–4, wherein the phase $\phi_i$ corresponds to the periodically incremented content of a phase register stage PR, that after a command for a frequency change, the increment procedure is stopped at the time $t_A$, that the phase $\phi_A$ of the old frequency $f_A$ is computed for the time $t_A$ or read out of the phase register (PR), and that the phase $\phi_N$ of the new frequency $f_N$ is computed for the subsequent time $t_N$ and from it is computed the phase $\Delta\phi = \phi_N(tn) - \phi_A(t_A)$, which is afterwards added, at a time $t_R$ $(t_A \leq t_r \leq t_N)$, to the content of the phase register stage (PR) or that the content of the phase register stage (PR), at a time $t_R$ $(t_A \leq t_R \leq t_N)$, is reset to zero and increased by the amount of the computed phase $\phi_N$, and that the increment procedure is restarted at a time $t_N$.

8. A method according to claim 7, wherein the periodic counting of the time interval from $t=0$ to $t=t_z$ and the increment procedure of the phase register stage, as well as the timing marks (ZM), if used, are controlled by the same master clock.

9. Apparatus for the generation of periodic electric oscillations at a frequency that can be arbitrarily determined, in which, after changing the frequency and resetting it to any desired value that has previously been generated, phase coherence is maintained with a computing system which is connected to a first input of a phase incrementing stage, which is connected to a phase register stage whose output is connected to a second input of the phase incrementing stage and to the input of a digital-analog converter, the apparatus comprising:

control logic and a time measuring unit, which is synchronized by a master clock frequency, the time measuring unit having time- and respectively, clock-signal emitting outputs connected to the computing system, further having an output for providing periodic timing marks and being connected to the control logic and further having a clock signal emitting output connected to the phase register stage, the computing system being further connected to the phase register stage by a reset line and to the control logic over two command lines and a status line, and the phase register stage being connected to the control logic over a command line.

* * * * *